United States Patent
Ho et al.

(10) Patent No.: US 11,362,085 B2
(45) Date of Patent: Jun. 14, 2022

(54) HIGH-VOLTAGE SEMICONDUCTOR DEVICE

(71) Applicant: Vanguard International Semiconductor Corporation, Hsinchu (TW)

(72) Inventors: Yu-Hao Ho, Keelung (TW); Hsiao-Ling Chiang, Hsinchu (TW); Yueh-Chu Chiang, Tainan (TW); Yi-Hsiang Huang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 147 days.

(21) Appl. No.: 16/925,622

(22) Filed: Jul. 10, 2020

(65) Prior Publication Data
US 2022/0013520 A1 Jan. 13, 2022

(51) Int. Cl.
*H01L 27/06* (2006.01)

(52) U.S. Cl.
CPC .............................. *H01L 27/0629* (2013.01)

(58) Field of Classification Search
CPC . H01L 27/0629; H01L 28/20; H01L 29/0634; H01L 29/0692; H01L 29/0696; H01L 29/405; H01L 29/7393; H01L 29/7817; H01L 29/7835
See application file for complete search history.

(56) References Cited

U.S. PATENT DOCUMENTS

| | | | |
|---|---|---|---|
| 2014/0021560 A1* | 1/2014 | Su | H01L 27/0629 257/E21.616 |
| 2015/0325694 A1 | 11/2015 | Chan | |
| 2016/0260704 A1* | 9/2016 | Huo | H01L 28/20 |
| 2017/0365599 A1* | 12/2017 | Lin | H01L 29/405 |
| 2019/0067190 A1 | 2/2019 | Wu et al. | |

FOREIGN PATENT DOCUMENTS

JP 2010147181 A * 7/2010 ......... H01L 27/0629

OTHER PUBLICATIONS

Taiwanese Office Action and Search Report dated Sep. 30, 2020 for Application No. 109109903.

* cited by examiner

*Primary Examiner* — Allan R Wilson
(74) *Attorney, Agent, or Firm* — Birch, Stewart, Kolasch & Birch, LLP

(57) ABSTRACT

A high-voltage semiconductor device includes a substrate, a body region, a well region, a bulk region, a source, a drain, an isolation region, a gate structure, and a resistor. The body region and the well region are disposed in the substrate. The bulk region and the source are disposed in the body region. The drain is disposed in the well region. The isolation region is disposed on the well region. The isolation region is disposed between the drain and the source. The gate structure is disposed on the substrate. The gate structure extends onto a portion of the isolation region. The resistor is disposed on the isolation region. The resistor is electrically connected to the bulk region and the drain, or the resistor is electrically connected to the drain and/or the source.

20 Claims, 15 Drawing Sheets

HIGH-VOLTAGE SEMICONDUCTOR DEVICE

BACKGROUND

Field of the Disclosure

The present disclosure relates to a semiconductor device, and in particular, to a high-voltage semiconductor device.

Description of the Related Art

High-voltage semiconductor devices are applied to the field of high-voltage and high-power integrated circuit. The advantages of high-voltage semiconductor device are cost effectiveness and easy compatibility with other processes. High-voltage semiconductor devices have been widely used in display driver ICs, power supplies, power management, communications, automotive electronics, industrial control, and so on. RESURF (REduced SURface Field) is often used to improve the withstanding voltage and device performance of high-voltage semiconductors. Methods of multi-RESURF, such as double RESURF and triple RESURF, have also been developed.

A voltage divider that includes a resistor is often utilized in high-voltage semiconductor devices. Generally, a resistor with high resistance is disposed on a field oxide (FOX) layer. In order to reduce the area or layout of an integrated circuit, a resistor with high resistance can be integrated into a high-voltage semiconductor device. The adjustment of the on-state resistance of the high-voltage semiconductor device depends on processing and/or design requirements. However, due to the limitations imposed by the shape of the high-voltage semiconductor device, the configuration of the resistor needs to be changed for adjusting the on-state resistance of the high-voltage semiconductor device, which may disturb the distribution of the electric field below the high-voltage semiconductor device and results in poor RESURF and an insufficient withstanding voltage.

SUMMARY

An embodiment of the present disclosure provides a high-voltage semiconductor device, which includes a substrate, a body region, a well region, a bulk region, a source, a drain, an isolation region, a gate structure, and a resistor. The body region and the well region are disposed in the substrate. The body region and the well region are spaced apart from each other. The body region has a first conductivity type. The well region has a second conductivity type. The second conductivity type is opposite to the first conductivity type. The bulk region and the source are disposed in the body region. The bulk region and the source are spaced apart from each other. The bulk region has the first conductivity type. The source has the second conductivity type. The drain is disposed in the well region. The isolation region is disposed on the well region and between the drain and the source. The gate structure is disposed on the substrate. The gate structure extends onto a portion of the isolation region. The resistor is disposed on the isolation region. The resistor may be electrically connected to the bulk region and the drain, or the resistor may be electrically connected to the drain and/or the source.

BRIEF DESCRIPTION OF THE DRAWINGS

The embodiments of the disclosure can be more fully understood by reading the subsequent detailed description and examples with references made to the accompanying drawings. In accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
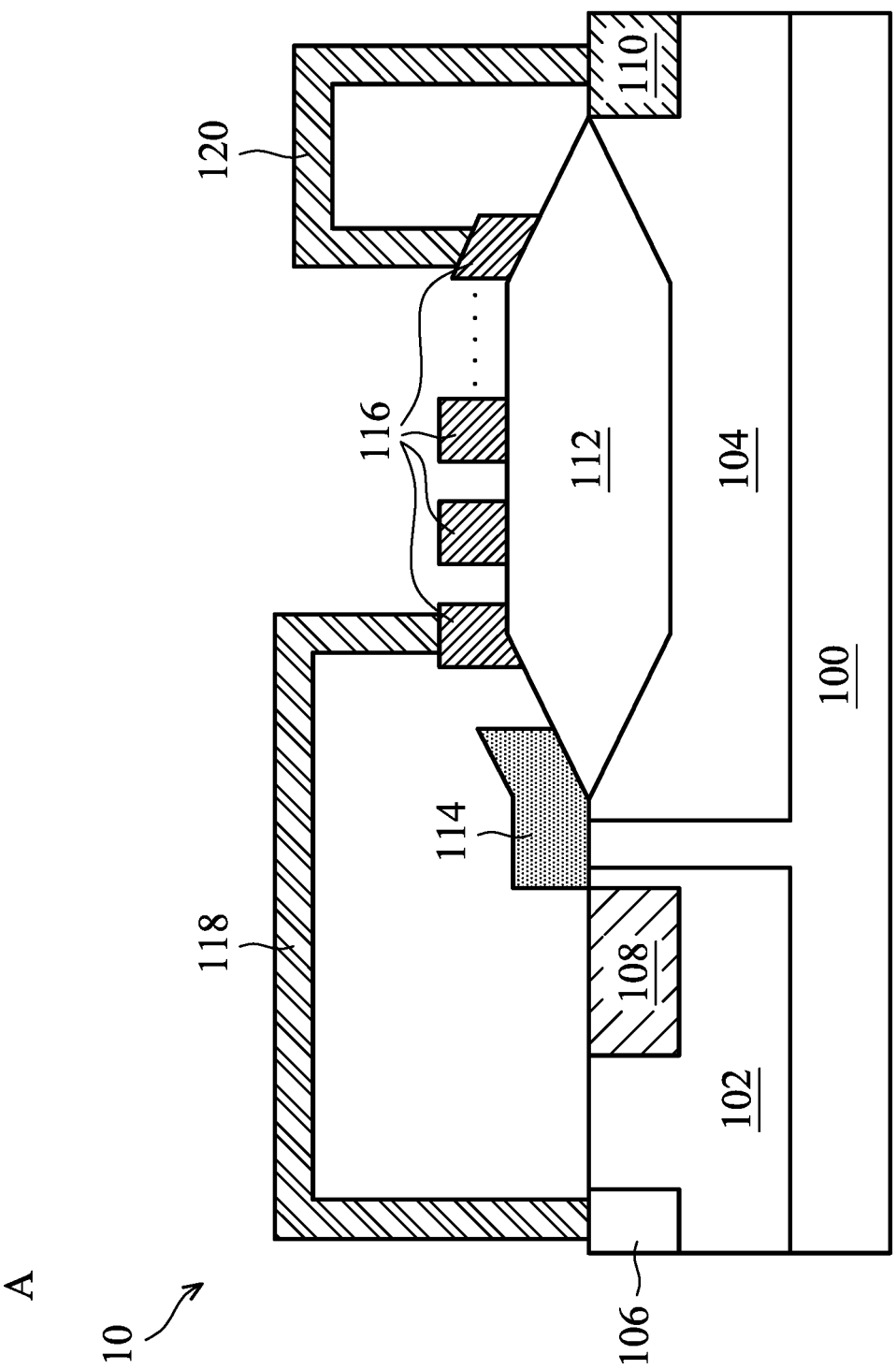
FIGS. 1, 2, 3A, 3B, and 4 illustrate cross-sectional views of a high-voltage semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A high-voltage semiconductor device is provided in embodiments of the present disclosure. In some embodiments, the surface field may be reduced to improve device performance by the electrical connection of a resistor, a bulk region, and a drain of a high-voltage semiconductor device or by the electrical connection of a resistor, a drain and/or a source of a high-voltage semiconductor device. In other embodiments, a resistor is connected in parallel with a conductor to adjust on-state resistance of a high-voltage semiconductor device based on process or design requirements. In some embodiments, a bulk region of a high-voltage semiconductor device is a ground terminal.

FIG. 1 illustrates a cross-sectional view of a high-voltage semiconductor device, in accordance with some embodiments of the present disclosure. High-voltage semiconductor device 10 includes a substrate 100, a body region 102, a well region 104, a bulk region 106, a source 108, a drain 110, an isolation region 112, a gate structure 114, a resistor 116, an interconnect 118, and an interconnect 120. The substrate 100 may be a semiconductor substrate, for example, including: an elemental semiconductor including silicon or germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP, or a combination thereof. In addition, the substrate 100 may also be a semiconductor on insulator. In an embodiment, the substrate 100 may be an undoped substrate. In some embodiments, the substrate 100 may be a doped substrate having a first conductivity type or a second conductivity type. In the embodiments of the present disclosure, the first conductivity type and the second conductivity type are opposite. For example, the first conductivity type is p-type and the second conductivity type is n-type. In another embodiment, the first conductivity type is n-type and the second conductivity type is p-type.

The body region 102 is in the substrate 100 and has the first conductivity type. In some embodiments, the body region 102 may be formed by ion implantation. In embodiments where the first conductivity type is p-type, the body region 102 may be formed by implanting boron or indium ion to the predetermined region where the body region 102 is to be formed. In embodiments where the first conductivity type is n-type, the body region 102 may be formed by implanting phosphorus or arsenic ion to the predetermined region where the body region 102 is to be formed.

The well region 104 is in the substrate 100 and has the second conductivity type. In some embodiments, the well region 104 may be formed through a process similar to the process described above for forming the body region 102. In some embodiments, the body region 102 and the well region 104 are spaced apart from each other, as shown in FIG. 1. In other embodiments, the body region 102 may be in physical contact with the well region 104.

The bulk region 106 is in the body region 102 and has the first conductivity type. In some embodiments, the bulk region 106 may be formed by ion implantation. In a possible embodiment, the dopant concentration of the bulk region 106 is greater than the dopant concentration of the body region 102. In some embodiments, the bulk region 106 is a ground terminal.

The source 108 is in the body region 102 and has the second conductivity type opposite to the conductivity type of the body region 102. In some embodiments, the source 108 may be formed by ion implantation. In some embodiments, the source 108 and the bulk region 106 are spaced apart from each other, as shown in FIG. 1. In other embodiments, the source 108 is in physical contact with the bulk region 106.

The drain 110 is in the well region 104. In some embodiments, the drain 110 may be formed by ion implantation. In some embodiments, the drain 110 has the second conductivity type opposite to the conductivity type of the well region 104, and the dopant concentration of the drain 110 is greater than the dopant concentration of the well region 104. In a possible embodiment, the drain 110 has the second conductivity type with the dopant concentration about equal to the dopant concentration of the source 108, and the source 108 and the drain 110 may be formed in the same ion implantation process.

The isolation region 112 is on the well region 104 and between the source 108 and the drain 110. In some embodiments, the isolation region 112 adjoins the drain 110, as shown in FIG. 1. In other embodiments, the isolation region 112 and the drain 110 are spaced apart from each other. The isolation region 112 may include local oxidation of silicon (LOCOS) or shallow trench isolation (STI). In some embodiments, the isolation region 112 is a field oxide layer. The isolation region 112 may be oxide, nitride, or oxynitride, or a combination thereof, which may be formed by oxidizing and/or nitriding the substrate, or performing a shallow trench isolation process. In some embodiments, the shallow trench isolation process includes: forming a hard mask layer on the substrate, patterning the hard mask, using the patterned hard mask layer as an etch mask for etching the substrate, performing a deposition process to fill a dielectric material into the a trench in the etched substrate, and performing a planarization process, such as a chemical mechanical polishing (CMP) process or a mechanical grinding process to remove the a excess portion of the dielectric material. The remaining portion of the dielectric material forms the shallow trench isolation region.

The gate structure 114 is on the body region 102 and extends to a portion of the isolation region 112. In one embodiment, the gate structure 114 (or referred to as a gate electrode) is a conductive material. In one embodiment, the gate structure 114 further includes a gate dielectric layer (not shown) between the gate structure 114 and the substrate 100. In some embodiments, a method for forming the gate structure 114 includes: sequentially depositing a blanket dielectric material layer (for forming a gate dielectric layer) on the substrate and depositing a blanket conductive material (for forming a gate electrode) on the dielectric material layer, and then patterning the dielectric material layer and the conductive material layer respectively by lithography and etch processes to form the gate dielectric layer and the gate electrode. The material of the gate dielectric layer may include silicon oxide, silicon nitride, or multiple layers thereof. In some embodiments, the gate dielectric layer may include high-k dielectric material, such as silicate or oxide of Hf, Al, Zr, La, Mg, Ba, Ti, Ta, Pb, or silicate or oxide of a combination thereof. In some embodiments, a method for forming the gate dielectric layer may include molecular-beam deposition (MBD), atomic layer deposition (ALD), plasma enhanced chemical vapor deposition (PECVD), or a combination thereof. The material of the gate electrode may include amorphous silicon, polycrystalline silicon, one or more metals, metal nitride, metal silicide, conductive metal oxide, or a combination thereof. In some embodiments, a method for forming the gate electrode may include chemical vapor deposition (CVD), sputtering, resistance heating evaporation, electron beam evaporation, or a combination thereof.

The resistor 116 is on the isolation region 112. In some embodiments, the resistance of the resistor 116 ranges from about 1M (million) to about 100M ohms. In some embodiments, the resistor 116 has a plurality of resistance segments of polycrystalline silicon connected in series, and the resistance segments have shapes of an arc, a straight line, or a combination thereof. In some embodiments, the resistor 116 is shaped like a circle, a running track, a finger (or fingers), or a spiral in the top view of the high-voltage semiconductor device 10. The resistor 116 is electrically connected to the bulk region 106 and the drain 110 through the interconnect 118 and the interconnect 120 respectively. In other embodiments, the resistor 116 is electrically connected to the drain 110 and/or source 108 through other interconnect. The material of the interconnects 118 and 120 includes amorphous silicon, polycrystalline silicon, one or more metals, metal nitride, metal silicide, conductive metal oxide, or a combination thereof. In some embodiments, the material of the interconnects 118 and 120 may be the same as the material of the gate electrode. The resistor 116 of some embodiments of the present disclosure is electrically connected to the bulk region 106 and the drain 110, which may reduce surface field to improve device performance and improve reliability and tolerance of process. In some embodiments, the bulk region 106 is a ground terminal. The material of the resistor 116 may include amorphous silicon, polycrystalline silicon, metal nitride, metal silicide, conductive metal oxide, metal, an alloy thereof, or a combination thereof. In some embodiments, the material of the resistor 116 includes silicon chromium (SiCr).

Figure 2:
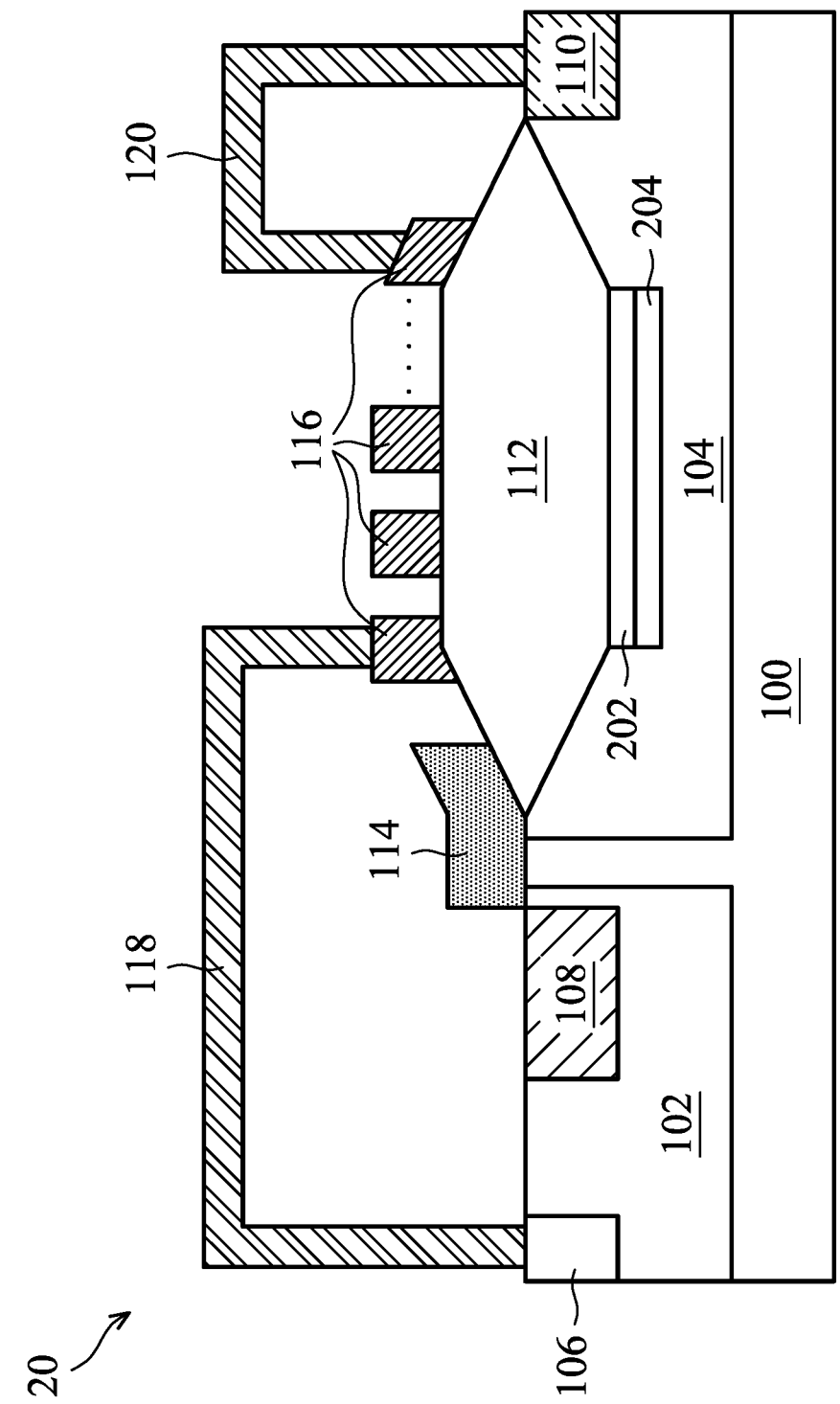

FIG. 2 illustrates a cross-sectional view of a high-voltage metal oxide semiconductor (MOS) device, in accordance with some embodiments of the present disclosure. The high-voltage metal oxide semiconductor device 20 is similar to the high-voltage semiconductor device 10, except that the high-voltage metal oxide semiconductor device 20 further includes a first doped region 202 and a second doped region 204. For simplicity, like features in FIG. 2 and FIG. 1 are designated with like reference numerals and the description is not repeated. The first doped region 202 is under the isolation region 112. The second doped region 204 is under the first doped region 202 and forms a junction with the first doped region 202, wherein the second doped region 204 and the first doped region 202 have opposite conductivity types. In some embodiments, the first doped region 202 and the second doped region 204 are formed by ion implantation. In such embodiments, at least one of the first doped region 202 and the second doped region 204 includes at least two sub-implant regions with different implant concentrations. In some embodiments, one of the sub-implant regions with a higher implant concentration is adjacent to the junction, and another one of the sub-implant regions with a lower implant concentration is distant from the junction. In some embodiments, the first doped region 202 and the second doped region 204 may be used to reduce the surface field of the isolation region 112 such that the surface field may be uniform. The widths of the first doped region 202 and the second doped region 204 in FIG. 2 are merely examples. In some embodiments, the widths of the first doped region 202 and the second doped region 204 may be different from the width of the bottom portion of the isolation region 112. In other embodiments, the width of the first doped region 202 may be different from the width of the second doped region 204.

Figure 3A:
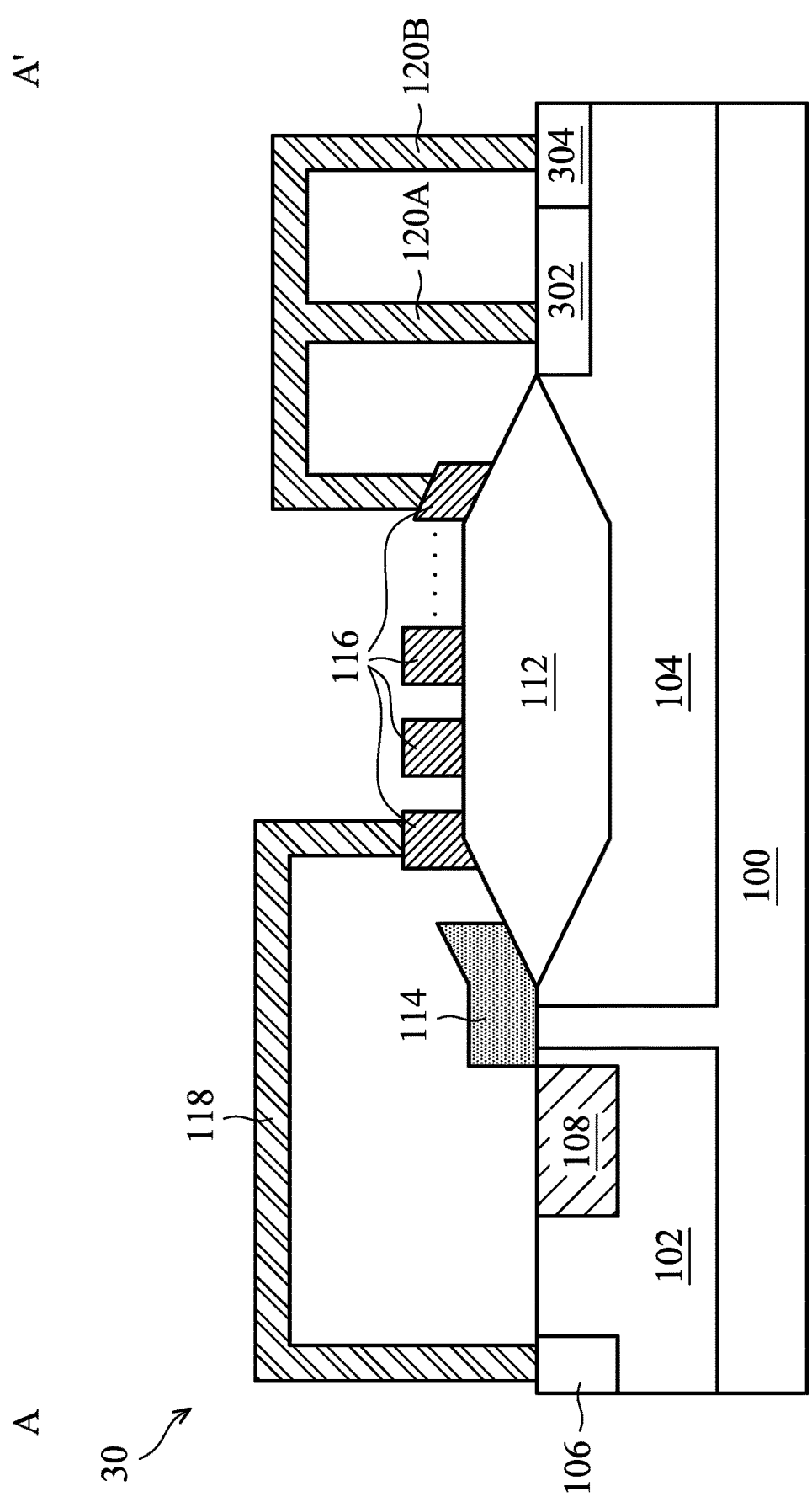
Figure 3B:
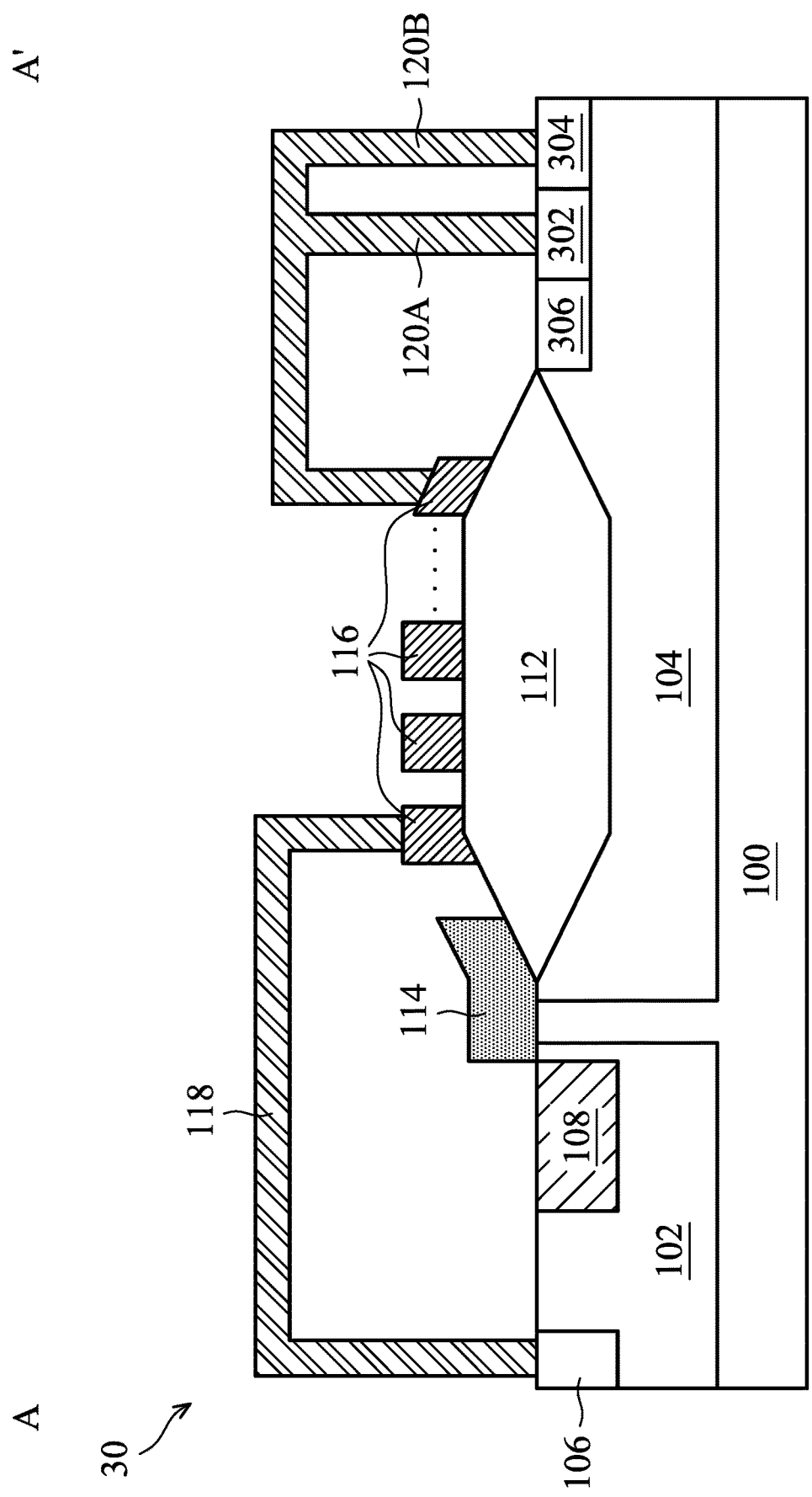

FIG. 3A illustrates a cross-sectional view of a high-voltage lateral insulated gate bipolar transistor (LIGBT) device, in accordance with some embodiments of the present disclosure. The high-voltage LIGBT device 30 is similar to the high-voltage semiconductor device 10, except that the drain of the high-voltage LIGBT 30 is formed of a doped region 302 and a doped region 304, which have opposite conductivity types. For simplicity, like features in FIG. 3A and FIG. 1 are designated with like reference numerals and the description is not repeated. In some embodiments, the resistor 116 of the high-voltage LIGBT device 30 is connected to the doped region 302 and the doped region 304 through an interconnect 120A and an interconnect 120B respectively. As described above, these embodiments may also reduce surface field to improve device performance and improve reliability and tolerance of process. In other embodiments, as shown in FIG. 3B, the high-voltage LIGBT device 30 further includes a doped region 306 between the isolation region 112 and the doped region 302, wherein the doped region 306 has the second conductivity type. In such embodiments, the doped region 306 between the isolation region 112 and the doped region 302 is not connected to the interconnect 120A and the interconnect 120B. In some embodiments, the doped region 306 between the isolation region 112 and the doped region 302 may improve breakdown voltage of high-voltage LIGBT device 30.

Figure 4:
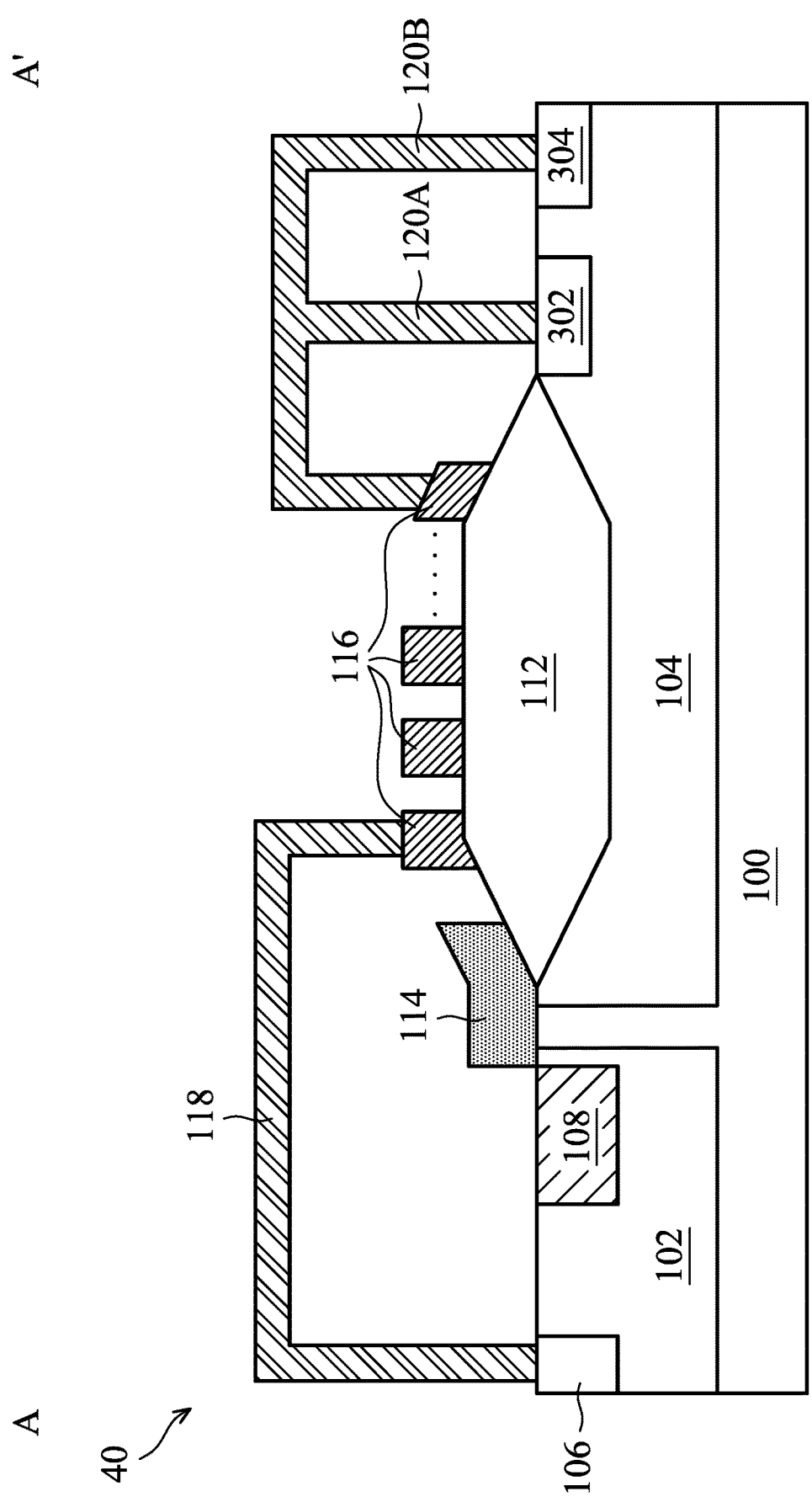

FIG. 4 illustrates a cross-sectional view of a high-voltage LIGBT device, in accordance with some embodiments of the present disclosure. The high-voltage LIGBT device 40 is similar to the high-voltage LIGBT device 30, except that the doped region 302 and the doped region 304 of the high-voltage LIGBT device 40 are spaced apart from each other. The current flowing in the interconnect 120A through the doped region 302 is increased since the doped region 302 and the doped region 304 are spaced apart from each other. Therefore, the voltage difference between the doped region 302 and the well region 104 is increased such that the high-voltage LIGBT device 40 is quickly triggered. In this embodiment, the trigger voltage of the high-voltage LIGBT is influenced by the distance between the doped regions 302 and 304. In some embodiments with the doped region 306 as described above and shown in FIG. 3B, the doped regions 302 and 304 may also be spaced apart from each other.

Figure 5:
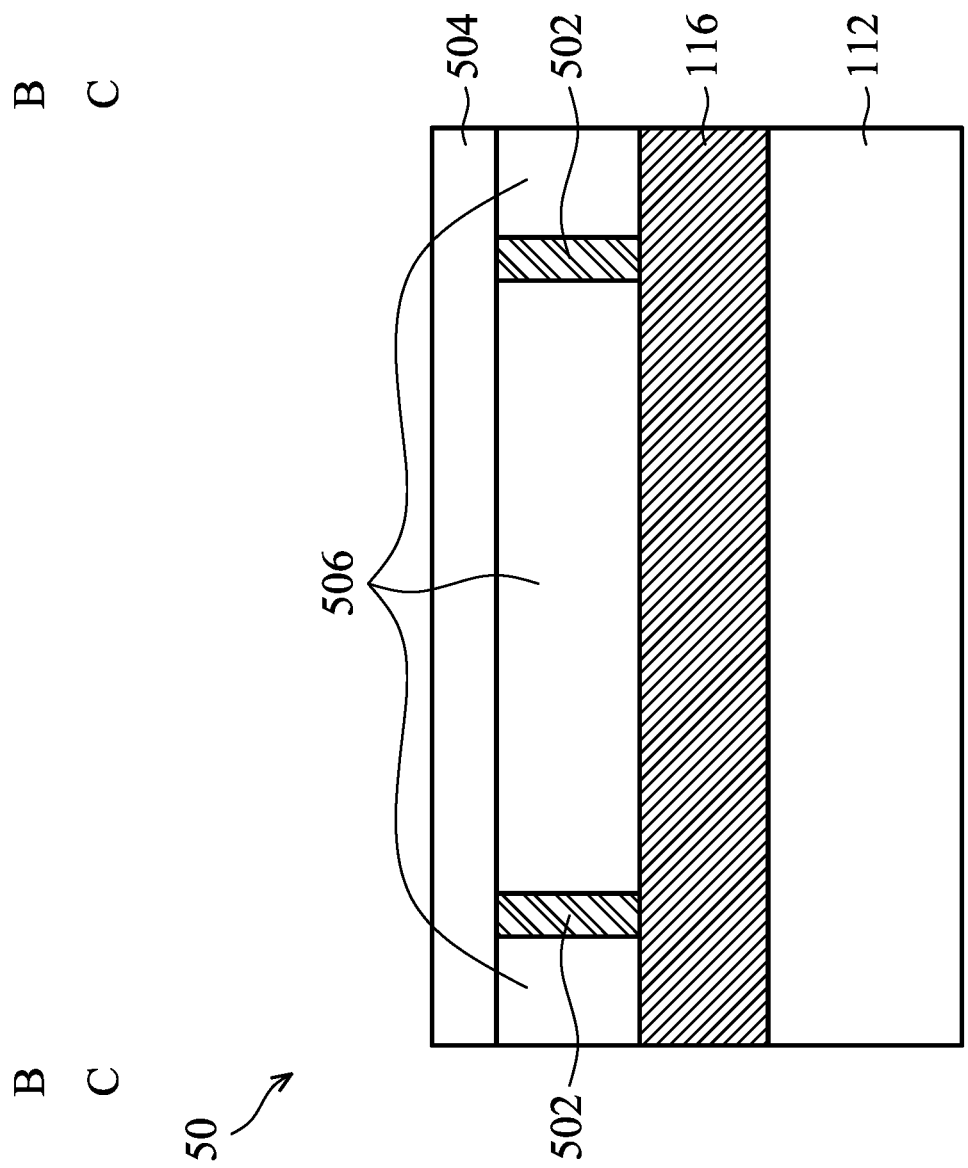
FIGS. 5 and 6 illustrate partial cross-sectional views of a high-voltage semiconductor device along the B-B curve in FIGS. 7C or 7D, or along the C-C line in FIGS. 8A, 8B, 9A, or 9B, in accordance with some embodiments of the present disclosure.
Figure 6:
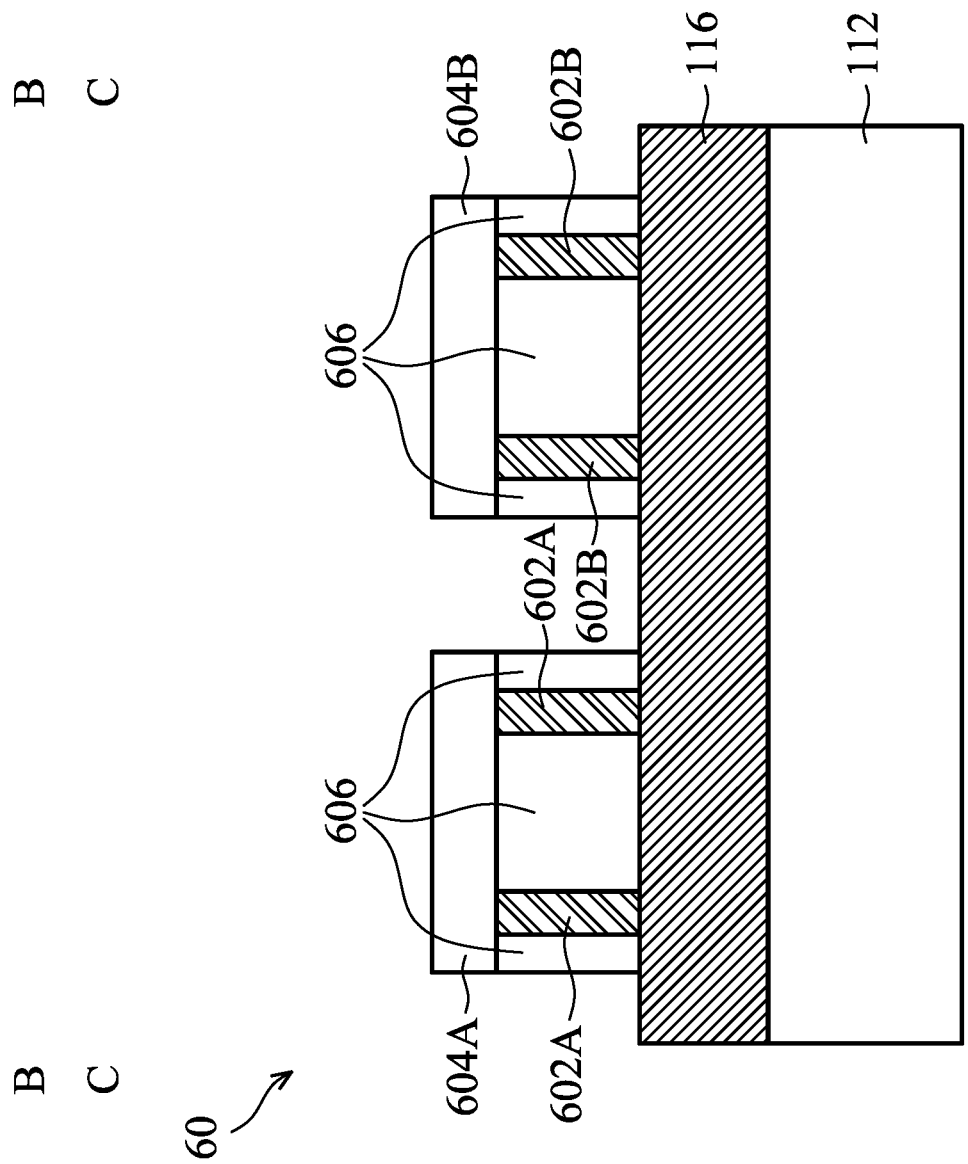

FIGS. 5 and 6 illustrate partial cross-sectional views of a parallel connection of a resistor and a conductor in a high-voltage semiconductor, in accordance with some embodiments of the present disclosure. In some embodiments, FIG. 5 or 6 may a partial cross-sectional view of a high-voltage semiconductor device along the B-B curve in FIG. 7C or 7D, or along the C-C line in FIGS. 8A, 8B, 9A, or 9B. The parallel connection, purpose, and advantages of these embodiments are described below. FIG. 5 illustrates a partial cross-sectional view of a high-voltage semiconductor device 50 according to some embodiments. The high-voltage semiconductor device 50 includes an isolation region 112, a resistor 116, contacts 502, a conductor 504, and an insulation layer 506. The conductor 504 is disposed on the resistor 116, the insulation layer 506 is disposed between the conductor 504 and the resistor 116, and the contacts 502 is disposed in the insulation layer 506. In one embodiment, the conductor 504 extends in a lengthwise direction of the resistor 116, and the resistance of the semiconductor device may be adjusted by the conductor 504 without affecting the surface field. In a preferred embodiment, the conductor 504 extends only in a lengthwise direction of a portion of the resistor 116 and is connected in parallel with the portion of the resistor 116 through the contacts 502. In some embodiments, the conductor 504 partially overlaps at least a portion of a vertically projected region of the resistor 116. In other embodiments, a vertically projected region of the conductor 504 is smaller than a vertically projected region of the resistor 116. The material of the conductor 504 includes amorphous silicon, polycrystalline silicon, metal nitride, metal silicide, conductive metal oxide, metal, an alloy thereof, or a combination thereof. For example, the material of the conductor 504 may include Cr, Au, Ag, W, Al, alloy thereof, or SiCr. The shape of the conductor 504 may vary depending on the shape of the resistor 116, and the shape of the conductor 504 is not limited in the embodiments of the present disclosure. The material of the contact 502 may include amorphous silicon, polycrystalline silicon, one or more metals, metal nitride, metal silicide, conductive metal oxide, or a combination thereof. The material of the insulation layer 506 may include oxide, nitride, or oxynitride, or a combination thereof. The relative area ratio of the conductor 504 and the resistor 116 can be adjusted by those skilled in the art according to actual requirements.

FIG. 6 illustrates a partial cross-sectional view of a high-voltage semiconductor device 60 according to other embodiments. The high-voltage semiconductor device 60 is similar to the high-voltage semiconductor device 50 except for the configuration of the conductor. The high-voltage semiconductor device 60 includes an isolation region 112, a resistor 116, contacts 602A and 602B, conductors 604A and 604B, and an insulation layer 606. The conductors 604A and 604B are disposed on the resistor 116, the insulation layer 606 is disposed between the conductor 604A and the resistor 116 and between the conductor 604B and the resistor 116, and the contacts 602A and 602B are disposed in the insulation layer 606. In an embodiment, the conductor 604A and the conductor 604B are disposed in a lengthwise direction (or lengthwise directions) of the resistor 116 and connected in parallel with a corresponding portion of the resistor 116 underlying each conductor through the contacts 602A and 602B respectively. In some embodiments, the conductors 604A and 604B partially overlap at least a portion of a vertically projected region of the resistor 116. In other embodiments, vertically projected regions of the conductors 604A and 604B are smaller than a vertically projected region of the resistor 116. The shapes of the conductors 604A and 604B may vary depending on the shape of the portion of resistor 116 underlying each conductor or depending on design requirements and are not limited in the embodiments of the present disclosure. The material of the conductors 604A and 604B may include Cr, Au, Ag, W, Al, alloy thereof, or SiCr. In some embodiments, the conductors 604A and 604B may be formed of the same material. In other embodiments, the conductors 604A and 604B may be formed of different materials. The material of the contacts 602A and 602B may include amorphous silicon, polycrystalline silicon, one or more metals, metal nitride, metal silicide, conductive metal oxide, or a combination thereof. In some embodiments, the contacts 602A and 602B may be formed of the same material. In other embodiments, the contacts 602A and 602B may be formed of different materials. The material of the insulation layer 606 may include oxide, nitride, or oxynitride, or a combination thereof. The conductors 604A and 604B described above are merely illustrative, and the number of conductors connected in parallel with portions of the resistor is not limited in the embodiments of the present disclosure. Depending on the process or design requirements, the number of conductors may be one or more. In some embodiments where a conductor is connected in parallel with a portion of a resistor, the on-state resistance of the device may be adjusted according to the process or design requirements without changing the configuration of the resistor, while maintaining the RESURF effect. For example, the resistance of the high-voltage semiconductor device with a conductor being connected in parallel with a portion of a resistor may be adjusted to maintain the resistance at the design value when the device size is enlarged or reduced. The relative area ratio of the conductor 604A and the resistor 116 and the relative area ratio of the conductor 604B and the resistor 116 can be adjusted by those skilled in the art according to actual requirements.

Figure 7A:
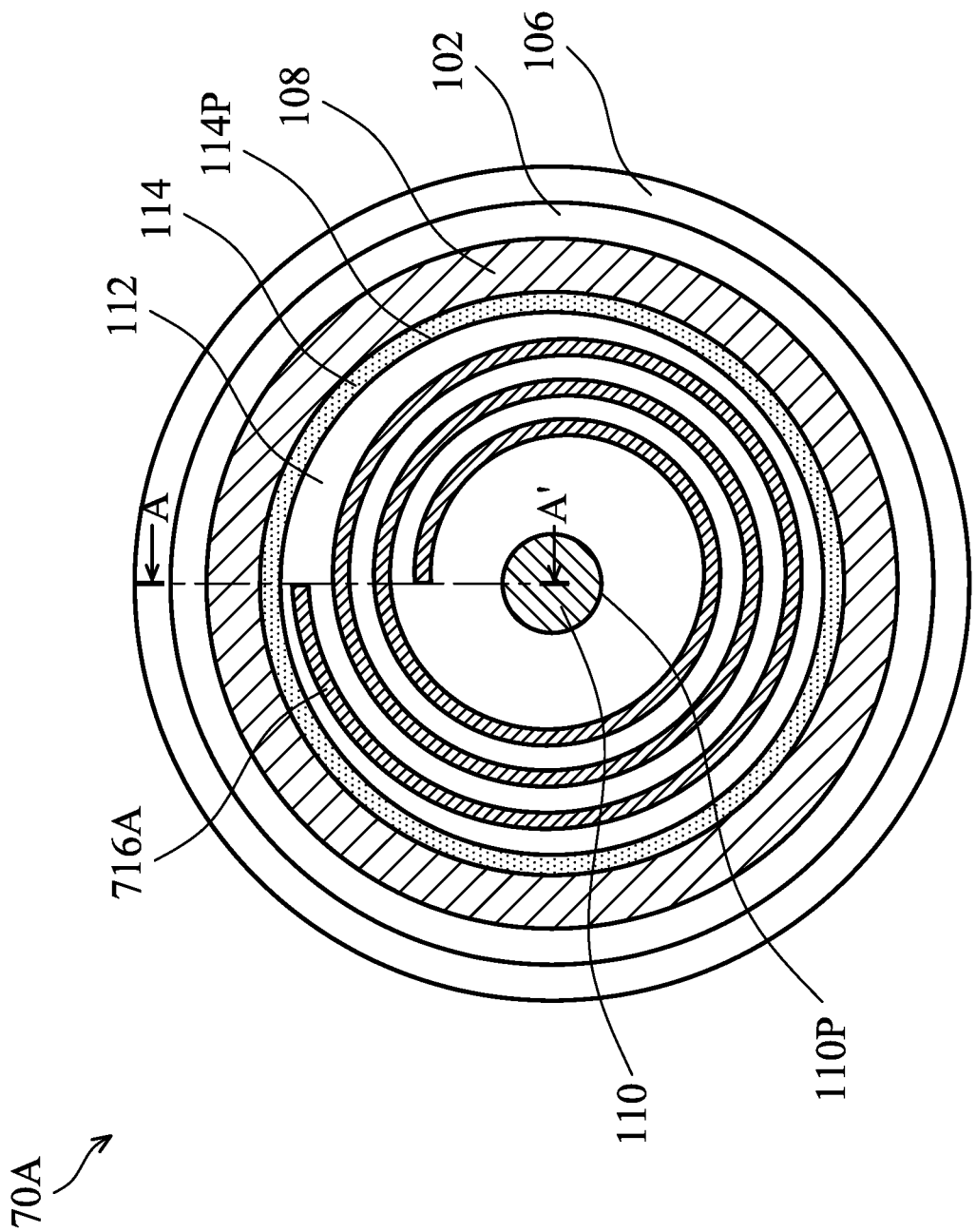
FIGS. 7A, 7B, 7C, 7D, 8A, 8B, 9A, and 9B illustrate top views of a high-voltage semiconductor device, in accordance with some embodiments of the present disclosure.
Figure 7B:
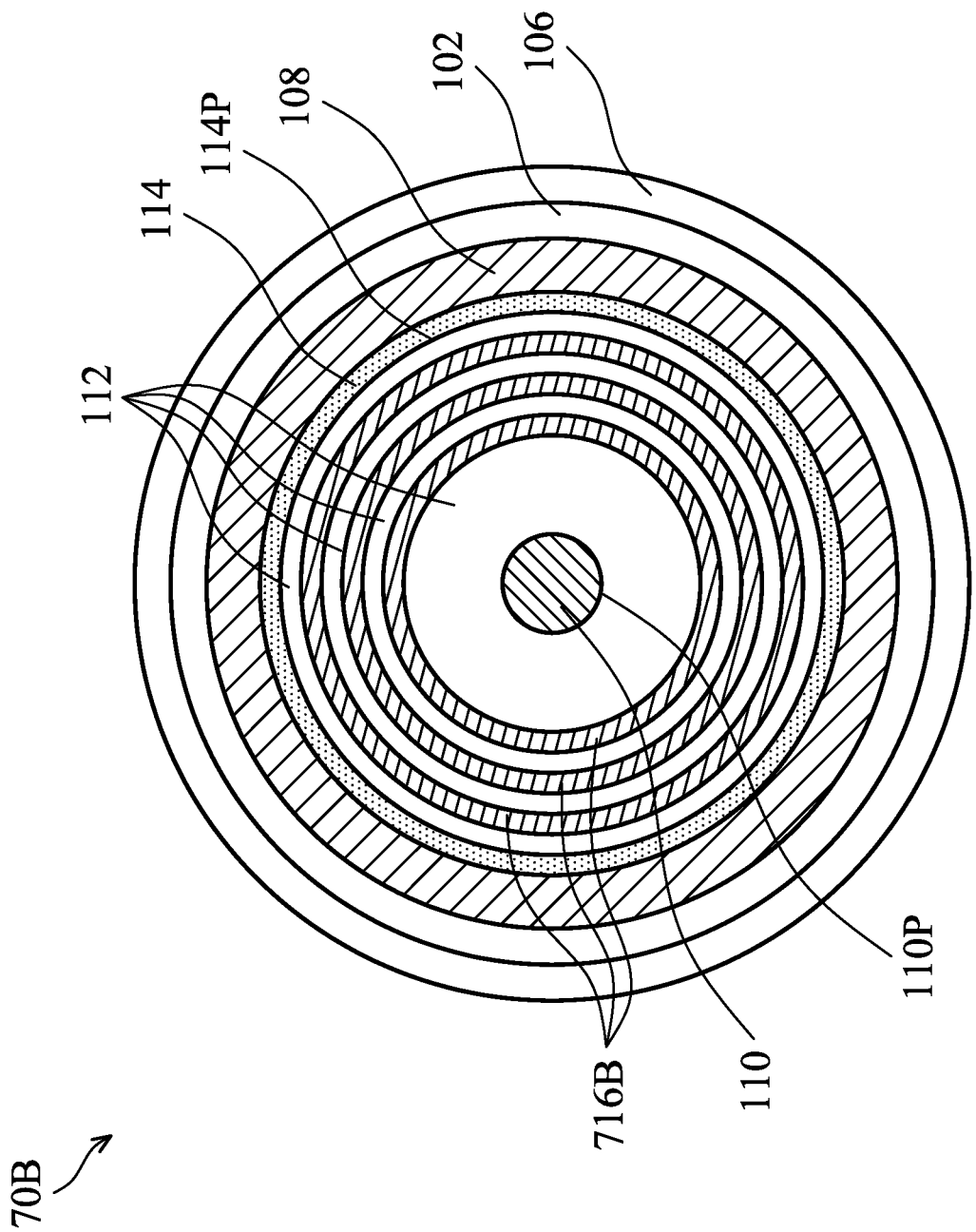
Figure 7C:
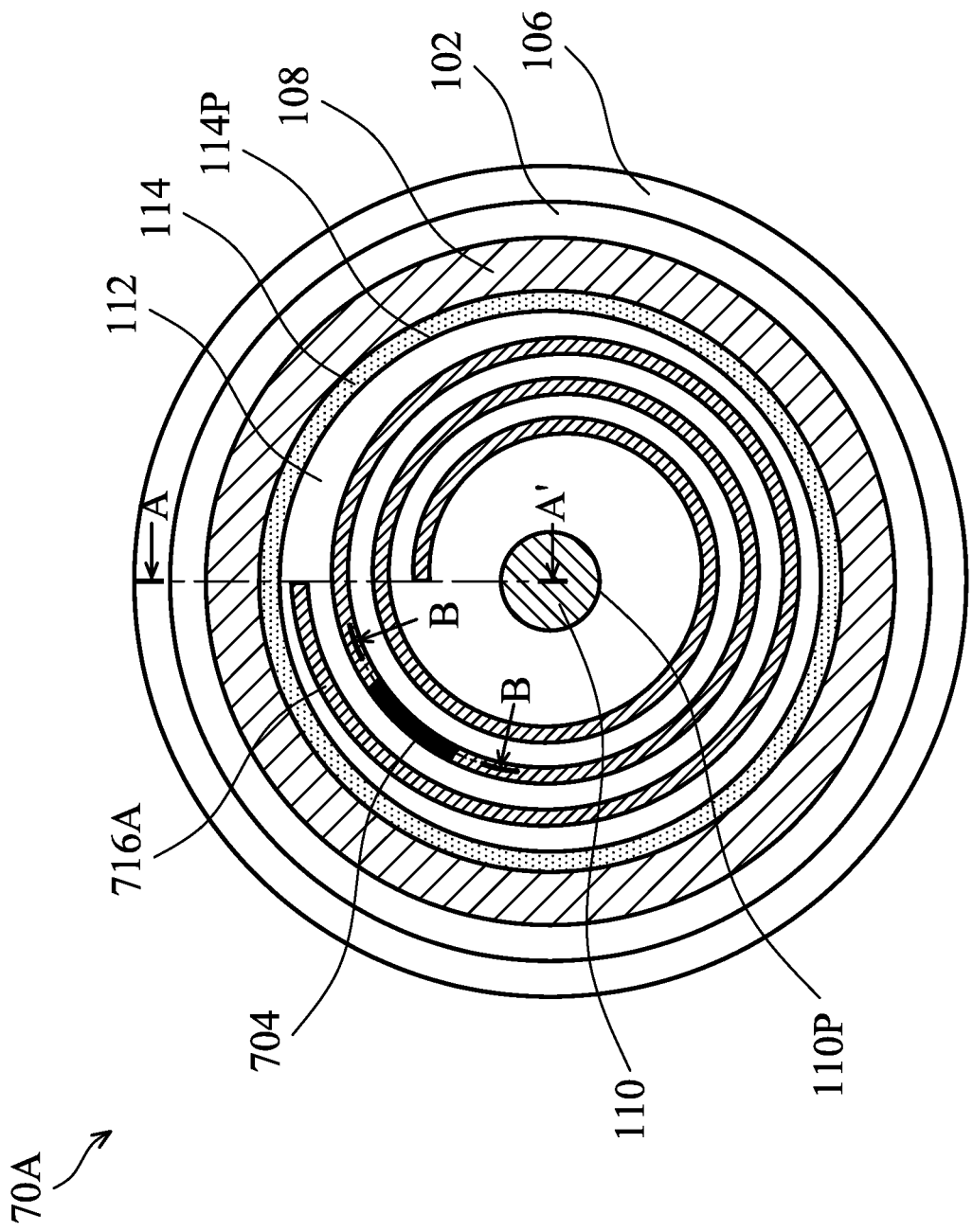

FIGS. 7A, 7B, 7C, 7D, 8A, 8B, 9A, and 9B illustrate top views of a high-voltage semiconductor device, in accordance with some embodiments of the present disclosure. FIG. 7A illustrates a top view of a high-voltage semiconductor device 70A, including a body region 102, a bulk region 106, a source 108, a drain 110, an isolation region 112, a gate structure 114, and a resistor 716 A. The body region 102 is surrounded by the bulk region 106, the source 108 is surrounded by the body region 102, the gate structure 114 is surrounded by the source 108, the isolation region 112 is surrounded by the gate structure 114, and the drain 110 is surrounded by the isolation region 112. The drain 110 has a profile 110P, and the gate structure 114 has an inner profile 114P. In some embodiments, the drain 110 has a ring shape. As shown in FIG. 7A, the resistor 716A is shaped like a spiral circle and is disposed on the isolation region 112 and between the profile 110P of the drain 110 and the inner profile 114P of the gate structure 114, and the profile 110P is surrounded by the resistor 716A. In some embodiments, one end of the resistor 716A is electrically connected to the drain 110 and the other end of the resistor 716A is electrically connected to the bulk region 106 through interconnects (not shown) respectively. In other embodiments, the resistor 716A is electrically connected to the drain 110 and/or the source 108 through other interconnects. In some embodiments, the resistance of the resistor 716A ranges from about 1M to about 100M ohms. FIG. 7C illustrates a top view of the high-voltage semiconductor device 70A according to some embodiments of the present disclosure. In FIG. 7C, the high-voltage semiconductor device 70A has a conductor 704 disposed on a portion of the resistor 716A, and the shape and area of the conductor 704 are the same as those of the portion of the resistor 716A underlying the conductor 704. The conductor 704 is connected in parallel with the portion of the resistor 716A underlying the conductor 704. In other embodiments, the shape or area of the conductor 704 is different from that of the portion of the resistor 716A underlying the conductor 704. The number of the conductor 704 is not limited in the embodiments of the present disclosure. Depending on the process or design requirements, the number may be one or more. The material of the conductor 704 may include amorphous silicon, polycrystalline silicon, metal nitride, metal silicide, conductive metal oxide, metal, an alloy thereof, or a combination thereof. In some embodiments, the material of the conductor includes Cr, Au, Ag, W, Al, alloy thereof, or SiCr. In some embodiments, FIGS. 1, 2, 3A, 3B, and 4 may be cross-sectional views of the high-voltage semiconductor device 70A along the A-A' line in FIG. 7A or 7C. According to some embodiments, FIG. 5 may be a cross-sectional view of the high-voltage semiconductor device 70A along the B-B curve in FIG. 7C.

Figure 7D:
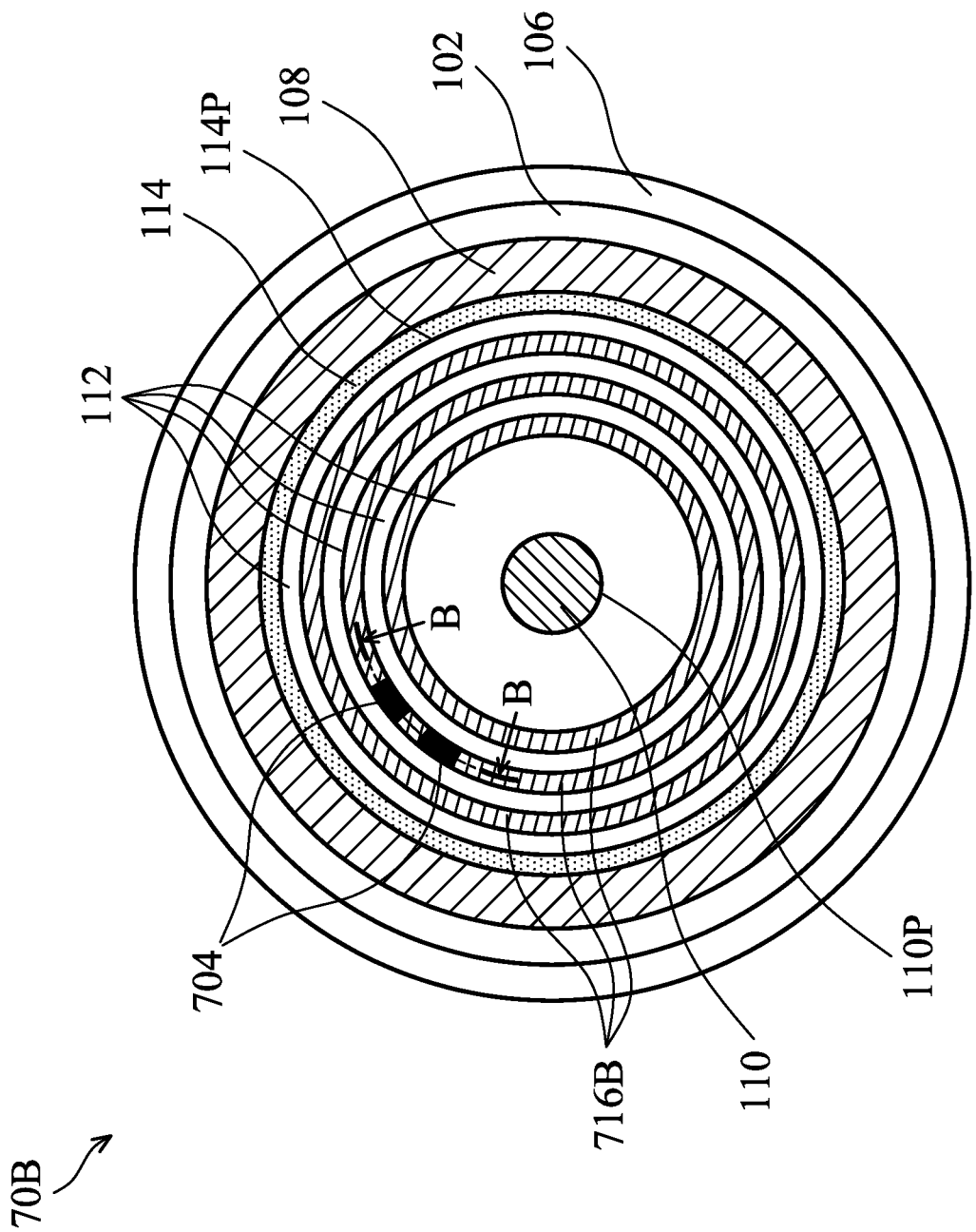

FIG. 7B illustrates a top view of a high-voltage semiconductor device, in accordance with some embodiments of the present disclosure. The high-voltage semiconductor device 70B is similar to the high-voltage semiconductor device 70A except for the configuration of the resistor. For simplicity, like features in FIG. 7B and FIG. 7A are designated with like reference numerals and the description is not repeated. The resistor 716B of the high-voltage semiconductor device 70B includes a plurality of resistors with concentric ring shapes and is disposed on the isolation region 112 and between the profile 110P of the drain 110 and the inner profile 114P of the gate structure 114. The plurality of resistors are spaced apart from each other and the profile 110P is surrounded by the resistor 716B. In some embodiments, each of the plurality of resistors is electrically connected to the drain 110 and the bulk region 106 respectively. In some embodiments, two non-overlapping contacts are disposed on each of the resistors with ring shapes, and one of the contacts is electrically connected to the drain 110 and another one of the contacts is electrically connected to the bulk region 106. The disposition of the contacts may vary depending on process requirements. The number of the resistors with concentric ring shapes is not limited in the embodiments of the present disclosure and may be one or more. The ring shapes of the resistors may vary depending on the shape of the high-voltage semiconductor device. For example, the ring shapes may include circles, ellipses, or a combination thereof. In some embodiments, the resistance of the resistor 716B ranges from about 1M to about 100M ohms. FIG. 7D illustrates a top view of the high-voltage semiconductor device 70B according to some embodiments of the present disclosure. In FIG. 7D, the high-voltage semiconductor device 70B has two conductors 704 disposed on portions of the resistor 716B, and the shape and area of each of the conductors 704 are the same as those of the portion of the resistor 716B underlying the corresponding conductor 704. Each of the conductors 704 is connected in parallel with the portion of the resistor 716B underlying the corresponding conductor 704. In other embodiments, the shape or area of each of the conductors 704 may be different from that of the portion of the resistor 716B underlying the corresponding conductor 704. The two conductors 704 illustrated in FIG. 7C are merely illustrative. Depending on the process or design requirements, the number of the conductors 704 may be one or more. In some embodiments, the material of the conductors includes Cr, Au, Ag, W, Al, alloy thereof. In some embodiments, FIG. 6 may be a cross-sectional view of the high-voltage semiconductor device 70B along the B-B curve in FIG. 7D.

Figure 8A:
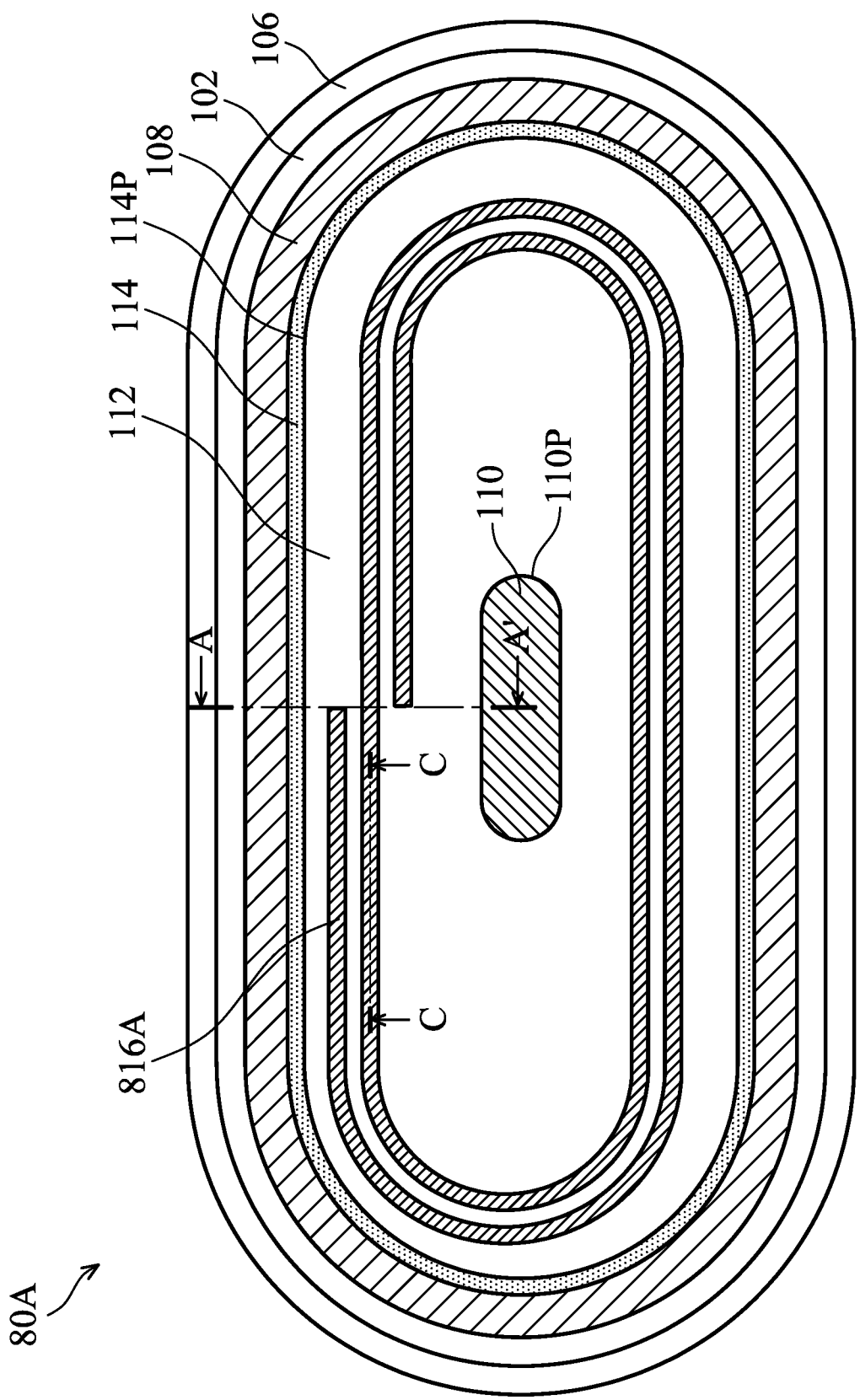

FIG. 8A illustrates a top view of a high-voltage semiconductor device 80A, in accordance with some embodiments of the present disclosure. As shown in FIG. 8A, the high-voltage semiconductor device 80A is shaped like a running track and includes a body region 102, a bulk region 106, a source 108, a drain 110, an isolation region 112, a gate structure 114, and a resistor 816A. The body region 102 is surrounded by the bulk region 106, the source 108 is surrounded by the body region 102, the gate structure 114 is surrounded by the source 108, the isolation region 112 is surrounded by the gate structure 114, and the drain 110 is surrounded by the isolation region 112. The drain 110 has a profile 110P, and the gate structure 114 has an inner profile 114P. As shown in FIG. 8A, the resistor 816A is shaped like a spiral running track and is disposed on the isolation region 112 and between the profile 110P of the drain 110 and the inner profile 114P of the gate structure 114, and the profile 110P is surrounded by the resistor 816A. In some embodiments, one end of the resistor 816A is electrically connected to the drain 110 and the other end of the resistor 816A is electrically connected to the bulk region 106 through interconnects (not shown) respectively. In other embodiments, the resistor 816A is electrically connected to the drain 110 and/or the source 108 through other interconnects. In some embodiments, the resistance of the resistor 816A ranges from about 1M to about 100M ohms. According to some embodiments of the present disclosure, the high-voltage semiconductor device 80A has one or more conductors disposed on a portion (or portions) of the resistor 816A. The configurations of the conductors, including the shape and area in the top view, the parallel connection with the portion of the resistor 816A underlying the corresponding conductor, the material of the conductors, and so on, are similar to the conductor 704 disposed on the resistor 716A and not repeated. It should be noted that the positioning of the conductor is not limited. For example, the conductor may be disposed on an arc portion or a straight-line portion of the resistor 816A. In some embodiments, FIGS. 1, 2, 3A, 3B, and 4 may be cross-sectional views of the high-voltage semiconductor device 80A along the A-A' line in FIG. 8A. In some embodiments where the high-voltage semiconductor device 80A has one or more conductors disposed on the resistor 816A along the C-C line in FIG. 8A, FIG. 5 or 6 may be a cross-sectional view of the high-voltage semiconductor device 80A along the C-C line.

Figure 8B:
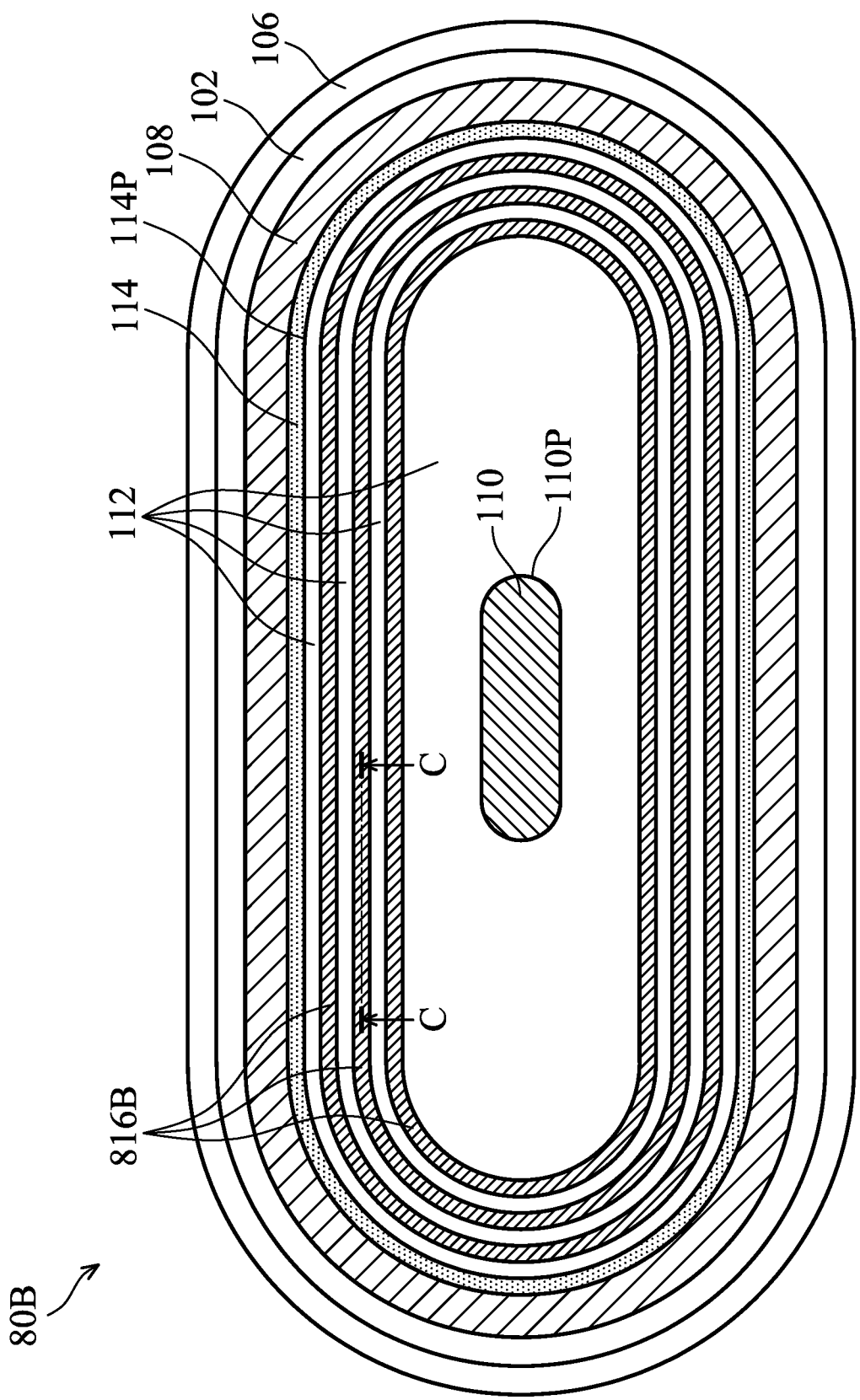

FIG. 8B illustrates a top view of a high-voltage semiconductor device, in accordance with some embodiments of the present disclosure. The high-voltage semiconductor device 80B is similar to the high-voltage semiconductor device 80A except for the configuration of the resistor. For simplicity, like features in FIG. 8B and FIG. 8A are designated with like reference numerals and the description is not repeated. The resistor 816B of the high-voltage semiconductor device 80B includes a plurality of resistors with concentric running track shapes and is disposed on the isolation region 112 and between the profile 110P of the drain 110 and the inner profile 114P of the gate structure 114. The plurality of resistors are spaced apart from each other and the profile 110P is surrounded by the resistor 816B. In some embodiments, each of the plurality of resistors is electrically connected to the drain 110 and the bulk region 106 respectively. For example, two non-overlapping contacts are disposed on each of the resistors with concentric running track shapes, and one of the contacts is electrically connected to the drain 110 and another one of the contacts is electrically connected to the bulk region 106. The disposition of the contacts may vary depending on process requirements. The number of the resistors with concentric running track shapes is not limited in the embodiments of the present disclosure and may be one or more. In some embodiments, the resistance of the resistor 816B ranges from about 1M to about 100M ohms. According to some embodiments of the present disclosure, the high-voltage semiconductor device 80B has one or more conductors disposed on a portion (or portions) of the resistor 816B. The configurations of the conductors, including the shape and area in the top view, the parallel connection with the portion of the resistor 816B underlying the corresponding conductor, the material of the conductors, and so on, are similar to the conductors 704 disposed on the resistor 716B and not repeated. In some embodiments where the high-voltage semiconductor device 80B has one or more conductors disposed on the resistor 816B along the C-C line in FIG. 8B, FIG. 5 or 6 may be a cross-sectional view of the high-voltage semiconductor device 80B along the C-C line. The disposition of the conductors on the resistor 816B along the C-C line in FIG. 8B is merely illustrative, and the conductors may be disposed in other positions, such as an arc portion or another straight-line portion of the resistor 816B.

Figure 9A:
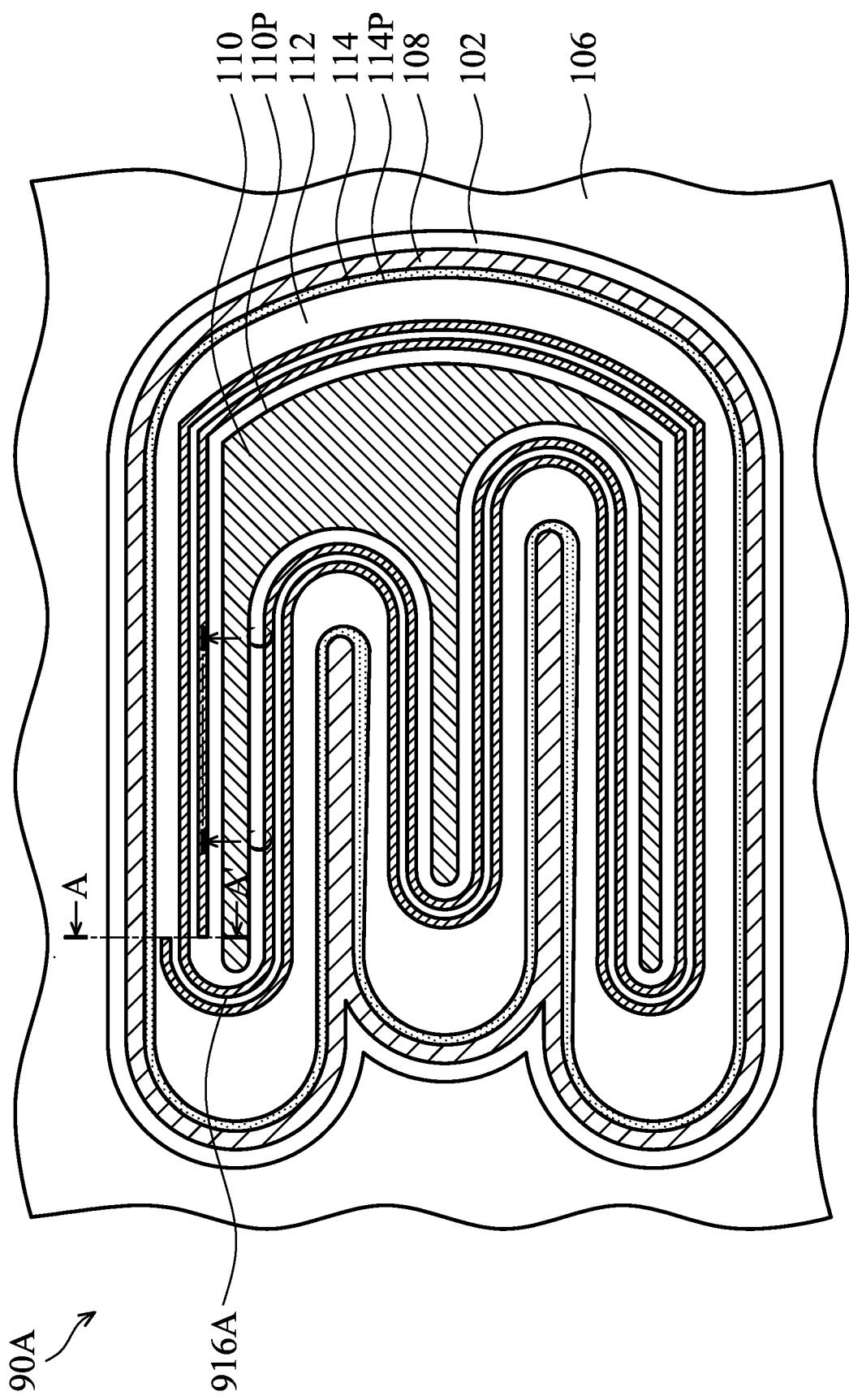

FIG. 9A illustrates a top view of a high-voltage semiconductor device 90A, in accordance with some embodiments of the present disclosure. As shown in FIG. 9A, the high-voltage semiconductor device 90A is shaped like fingers and includes a body region 102, a bulk region 106, a source 108, a drain 110, an isolation region 112, a gate structure 114, and a resistor 916A. The body region 102 is surrounded by the bulk region 106, the source 108 is surrounded by the body region 102, the gate structure 114 is surrounded by the source 108, the isolation region 112 is surrounded by the gate structure 114, and the drain 110 is surrounded by the isolation region 112. The drain 110 has a profile 110P, and the gate structure 114 has an inner profile 114P. In some embodiments, the drain 110 is shaped like fingers. As shown in FIG. 9A, the resistor 916A is shaped like spiral fingers and is disposed on the isolation region 112 and between the profile 110P of the drain 110 and the inner profile 114P of the gate structure 114, and the profile 110P is surrounded by the resistor 916A. In some embodiments, one end of the resistor 916A is electrically connected to the drain 110 and the other end of the resistor 916A is electrically connected to the bulk region 106 through interconnects (not shown) respectively. In other embodiments, the resistor 916A is electrically connected to the drain 110 and/or the source 108 through other interconnects. In some embodiments, the resistance of the resistor 916A ranges from about 1M to about 100M ohms. According to some embodiments of the present disclosure, the high-voltage semiconductor device 90A has one or more conductors disposed on a portion (or portions) of the resistor 916A. The configurations of the conductors, including the shape and area in the top view, the parallel connection with the portion of the resistor 916A underlying the corresponding conductor, the material of the conductors, and so on, are similar to the conductor 704 disposed on the resistor 716A and not repeated. It should be noted that the way the conductor is positioned is not limited. For example, the conductor may be disposed on an arc portion or a straight-line portion of the resistor 916A. In some embodiments, FIGS. 1, 2, 3A, 3B, and 4 may be cross-sectional views of the high-voltage semiconductor device 90A along the A-A' line in FIG. 9A. In some embodiments where the high-voltage semiconductor device 90A has one or more conductors disposed on the resistor 916A along the C-C line in FIG. 9A, FIG. 5 or 6 may be a cross-sectional view of the high-voltage semiconductor device 90A along the C-C line.

Figure 9B:
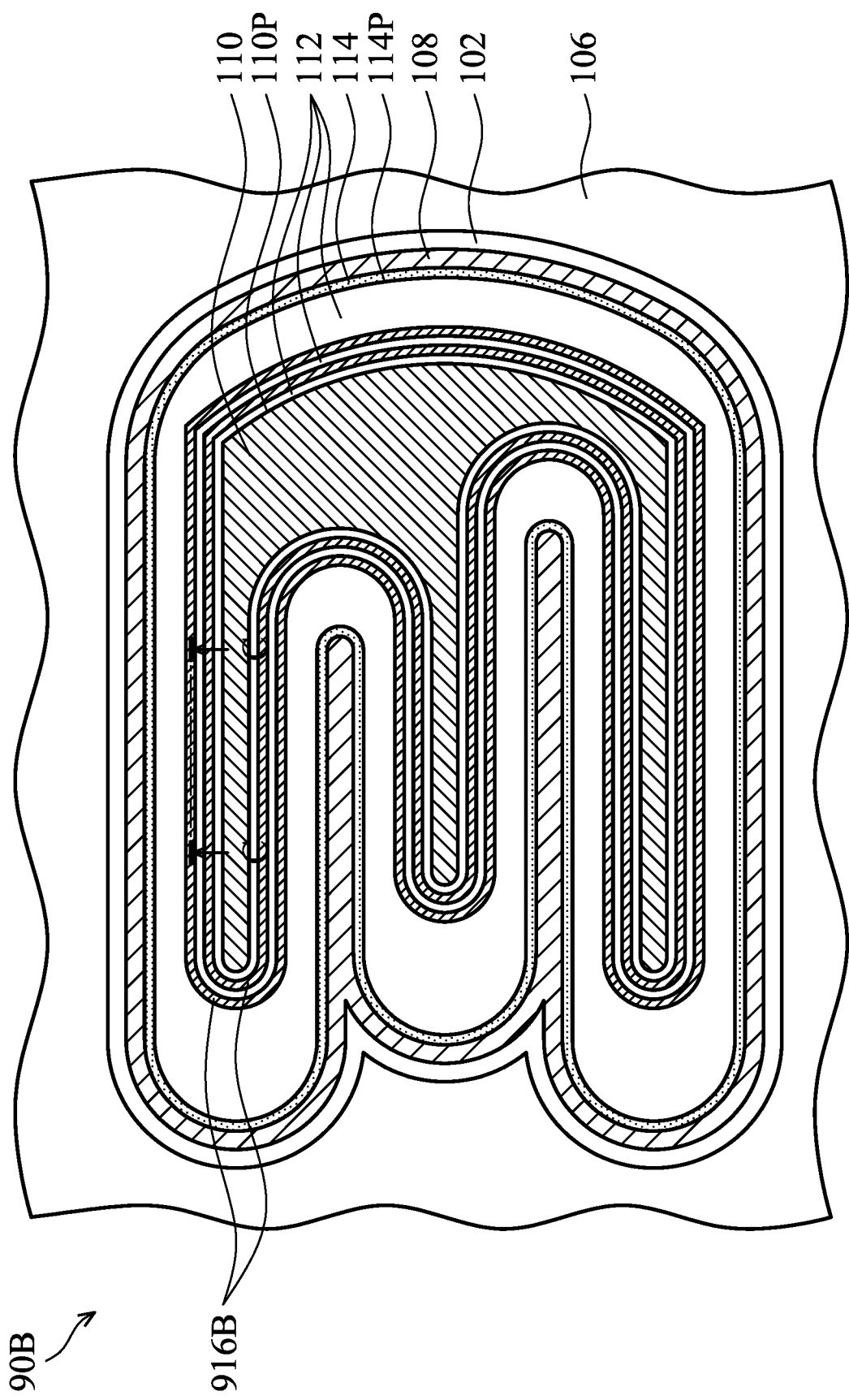

FIG. 9B illustrates a top view of a high-voltage semiconductor device 90B, in accordance with some embodiments of the present disclosure. The high-voltage semiconductor device 90B is similar to the high-voltage semiconductor device 90A except for the configuration of the resistor. For simplicity, like features in FIG. 9B and FIG. 9A are designated with like reference numerals and the description is not repeated. The resistor 916B of the high-voltage semiconductor device 90B includes a plurality of resistors with shapes of fingers (or shapes of concentric fingers) and is disposed on the isolation region 112 and between the profile 110P of the drain 110 and the inner profile 114P of the gate structure 114. The plurality of resistors are spaced apart from each other and the profile 110P is surrounded by the resistor 916B. In some embodiments, each of the plurality of resistors with shapes of fingers is electrically connected to the drain 110 and the bulk region 106 respectively. In some embodiments, two non-overlapping contacts are disposed on each of the resistors with shapes of fingers, and one of the contacts is electrically connected to the drain 110 and another one of the contacts is electrically connected to the bulk region 106. The disposition of contacts may vary depending on process requirements. The number of the resistors with shapes of fingers is not limited in the embodiments of the present disclosure and may be one or more. In some embodiments, the resistance of the resistor 916B ranges from about 1M to about 100M ohms. According to some embodiments of the present disclosure, the high-voltage semiconductor device 90B has one or more conductors disposed on a portion (or portions) of the resistor 916B. The configurations of the conductors, including the shape and area in the top view, the parallel connection with the portion of the resistor 916B underlying the corresponding conductor, the material of the conductors, and so on, are similar to the conductors 704 disposed on the resistor 716B and not repeated. In some embodiments where the high-voltage semiconductor device 90B has one or more conductors disposed on the resistor 916B along the C-C line in FIG. 9B, FIG. 5 or 6 may be a cross-sectional view of the high-voltage semiconductor device 90B along the C-C line. The disposition of the conductors on the resistor 916B along the C-C line in FIG. 9B is merely illustrative, and the conductors may be disposed in other positions, such as an arc portion or another straight-line portion of the resistor 916B. The high-voltage semiconductor devices with various shapes described above are merely examples and are not to limit embodiments of the present disclosure. The embodiments of the present disclosure can be applied to semiconductor devices with other shapes.

In accordance with some embodiments of the present disclosure, the resistor in a high-voltage semiconductor device is disposed on an isolation region and is electrically connected to the bulk region and the drain, or it may be electrically connected to the drain and/or the source, to reduce the surface field and improve the device's performance. For example, the breakdown voltage may be maintained above a given value in different processing conditions, such as above 500V when the well region has different dopant concentrations. In further embodiments of the present disclosure, a parallel connection of a conductor and the resistor may be used to not only reduce the surface field and improve performance of the device, but also adjust on-state resistance according to process and/or design requirements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A high-voltage semiconductor device, comprising:
a substrate;
a body region and a well region disposed in the substrate and spaced apart from each other, wherein the body region has a first conductivity type and the well region has a second conductivity type opposite to the first conductivity type;
a bulk region and a source disposed in the body region and spaced apart from each other, wherein the bulk region has the first conductivity type and the source has the second conductivity type;
a drain disposed in the well region;
an isolation region disposed on the well region and between the drain and the source;
a gate structure disposed on the substrate and extending onto a portion of the isolation region; and
a resistor disposed on the isolation region and electrically connected to the bulk region and the drain or electrically connected to the drain and/or the source.

2. The device as claimed in claim 1, wherein the drain has a profile surrounded by the resistor.

3. The device as claimed in claim 2, wherein the gate structure has an inner profile, and the resistor is between the inner profile and the profile of the drain.

4. The device as claimed in claim 1, wherein the drain has a ring shape and the resistor has a spiral shape or a plurality of concentric ring shapes.

5. The device as claimed in claim 4, wherein the plurality of concentric ring shapes comprise a circle, an ellipse, or a combination thereof.

6. The device as claimed in claim 1, wherein the drain has a finger shape and the resistor has a spiral finger shape or a plurality of concentric finger shapes.

7. The device as claimed in claim 1, further comprising:
at least one conductor disposed on the resistor;
an insulation layer disposed between the at least one conductor and the resistor; and
a plurality of contacts disposed in the insulation layer, wherein the resistor is connected in parallel with the at least one conductor through the contacts.

8. The device as claimed in claim 7, wherein the at least one conductor extends in a lengthwise direction of the resistor, and the at least one conductor partially overlaps at least a portion of a vertically projected region of the resistor.

9. The device as claimed in claim 7, wherein a vertically projected region of the at least one conductor is smaller than a vertically projected region of the resistor.

10. The device as claimed in claim 7, wherein a material of the at least one conductor comprises amorphous silicon, polycrystalline silicon, metal nitride, metal silicide, conductive metal oxide, metal, an alloy thereof, or a combination thereof.

11. The device as claimed in claim 1, wherein a material of the resistor comprises amorphous silicon, polycrystalline silicon, metal nitride, metal silicide, conductive metal oxide, metal, an alloy thereof, or a combination thereof.

12. The device as claimed in claim 1, further comprising:
a first doped region disposed under the isolation region;
a second doped region disposed under the first doped region and forming a junction with the first doped region, wherein the second doped region and the first doped region have opposite conductivity types.

13. The device as claimed in claim 12, wherein at least one of the first doped region and the second doped region comprises at least two sub-implant regions with different implant concentrations.

14. The device as claimed in claim 13, wherein one of the sub-implant regions with a higher implant concentration is adjacent to the junction, and another one of the sub-implant regions with a lower implant concentration is distant from the junction.

15. The device as claimed in claim 1, wherein the drain comprises two doped regions with opposite conductivity types.

16. The device as claimed in claim 15, wherein the resistor is connected to the two doped regions respectively.

17. The device as claimed in claim 15, wherein the two doped regions are spaced apart from each other.

18. The device as claimed in claim 15, further comprising another doped region disposed between the isolation region and the two doped regions.

19. The device as claimed in claim 1, wherein the bulk region is connected to ground.

20. The device as claimed in claim 1, wherein the resistor has a plurality of resistance segments connected in series, and the segments have shapes of an arc, a straight line, or a combination thereof.

* * * * *